US012482692B2

(12) United States Patent
Chadha et al.

(10) Patent No.: US 12,482,692 B2
(45) Date of Patent: Nov. 25, 2025

(54) EFFICIENT DECHUCKING AND PARTICLE MANAGEMENT IN PROCESS CHAMBERS

(71) Applicant: Applied Materials, Inc., Santa Clara, CA (US)

(72) Inventors: Arvinder Manmohan Singh Chadha, San Jose, CA (US); Christopher Laurent Beaudry, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 152 days.

(21) Appl. No.: 18/408,497

(22) Filed: Jan. 9, 2024

(65) Prior Publication Data
US 2025/0226255 A1 Jul. 10, 2025

(51) Int. Cl.
*H01J 37/32* (2006.01)
*H01L 21/683* (2006.01)

(52) U.S. Cl.
CPC .... *H01L 21/6833* (2013.01); *H01J 37/32715* (2013.01); *H01J 2237/0041* (2013.01); *H01J 2237/2007* (2013.01); *H01J 2237/20235* (2013.01)

(58) Field of Classification Search
CPC .............. H01L 21/67248; H01L 22/14; H01L 21/6833; H01L 21/67115; H01L 21/6831; H01L 21/68742; H01L 21/6875; G02F 1/133788; C23C 14/505; G01L 5/0076; H01J 37/32715; H01J 2237/0041; H01J 2237/2007; H01J 2237/20235
See application file for complete search history.

(56) References Cited

U.S. PATENT DOCUMENTS

| 11,664,263 B2 * | 5/2023 | Aoki | H01L 21/67248 361/234 |
| 2010/0271744 A1 * | 10/2010 | Ni | H01L 22/14 361/233 |
| 2020/0110317 A1 * | 4/2020 | Huang | G02F 1/133788 |
| 2020/0161095 A1 * | 5/2020 | Swaminathan | C23C 14/505 |
| 2022/0367237 A1 * | 11/2022 | Liu | G01L 5/0076 |

OTHER PUBLICATIONS

International Search Report and Written Opinion for International Application No. PCT/US2025/010778, mailed May 2, 2025, 9 Pages.

* cited by examiner

*Primary Examiner* — Elim Ortiz
(74) *Attorney, Agent, or Firm* — Lowenstein Sandler LLP

(57) ABSTRACT

A method including using a plurality of clamp electrodes of a substrate support to electrostatically secure a substrate during a process. The method further includes actively discharging a residual charge from the substrate after completion of the process based on at least one of contacting a backside of the substrate with a conductive lift pin or exposing the substrate to ultraviolet light. The method further includes raising a plurality of lift pins disposed in the substrate support to a first height to lift the substrate off of the substrate support after the discharging of the residual charge.

21 Claims, 10 Drawing Sheets

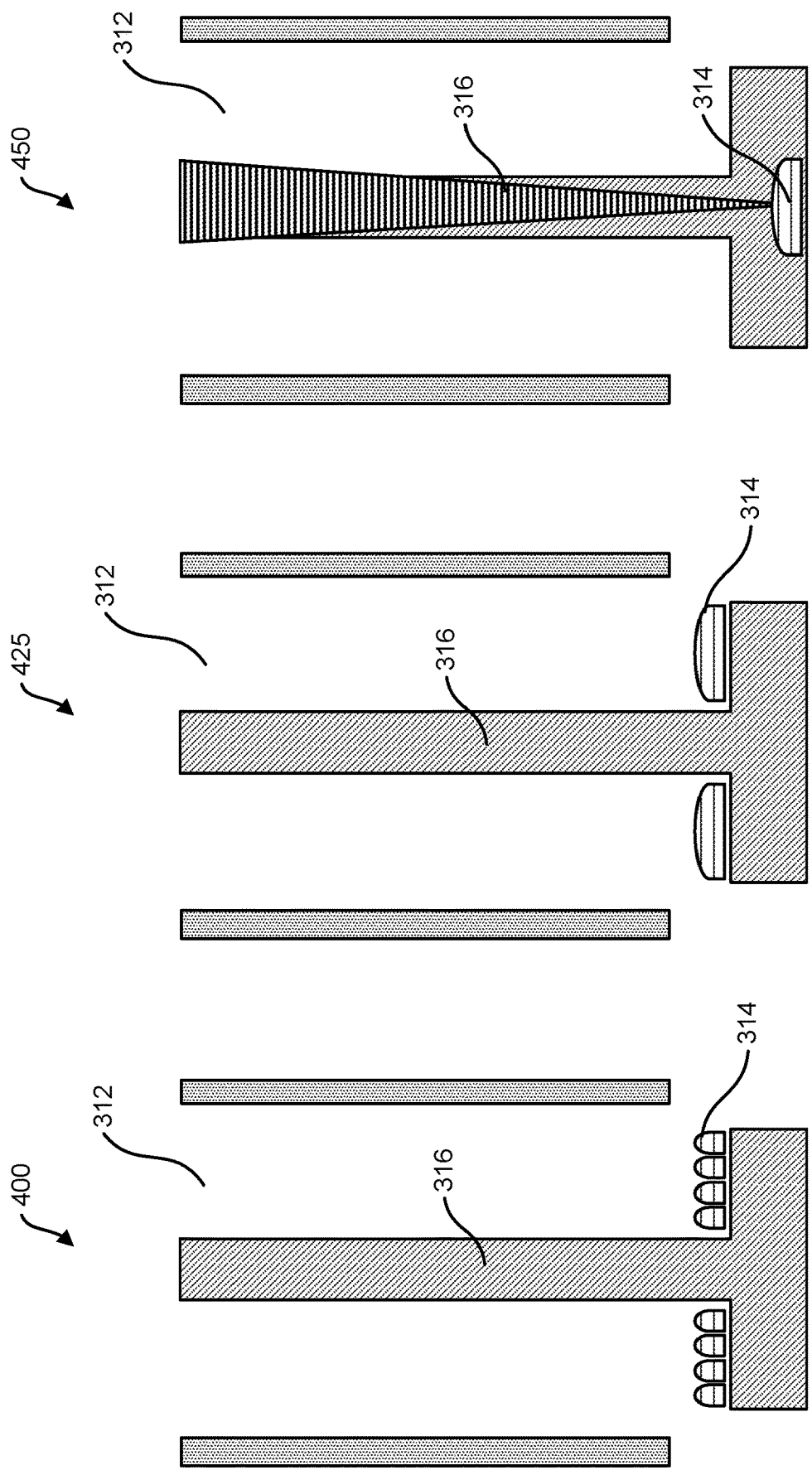

EFFICIENT DECHUCKING AND PARTICLE MANAGEMENT IN PROCESS CHAMBERS

TECHNICAL FIELD

Some embodiments of the present disclosure relate, in general, to systems and methods for efficiently separating a substrate from a substrate support by actively discharging a residual charge from the substrate.

BACKGROUND

Chucks are widely used to hold and secure substrates, such as semiconductor wafers, during various substrate processes like etching, deposition, and lithography. The specific type of chuck used depends on the specific requirements of the semiconductor manufacturing process, including factors such as wafer size, material, temperature sensitivity, and process compatibility. Some commonly used chucks include vacuum chucks, electrostatic chucks, mechanical chucks, magnetic chucks, piezoelectric chucks, wafer carrier chucks, edge grip chucks, heated chucks, and coolant chucks.

Electrostatic chucks (ESCs) typically include one or two or more electrodes embedded within a unitary chuck body, which includes a dielectric or semi-conductive ceramic material across which an electrostatic clamping field can be generated to chuck a substrate. ESCs are traditionally formed from a single, monolithic, ceramic body that includes all of the functional elements of the electrostatic chuck. An organic bonding material is traditionally used to bond the ceramic body to a metal cooling plate, which limits power dissipation for high temperature processes such as etching.

Some conventional electrostatic chucks use metal cooling plates that may be coated with a dielectric using spray coating, anodization, or a combination thereof. However, the quality of the coating may degrade due to stress, fatigue, and/or creep that may result from thermal cycling and may eventually lead to arcing. Stresses within the electrostatic chuck may arise due to difference in the coefficients of thermal expansion of the materials used in forming the electrostatic chuck. Plasma may also wear off the bond material bonding two or more components of the electrostatic chuck, which may result in degrading performance across the wafer. As a result, the plates forming the chuck may need to be replaced from time to time. In some instances, the plates may crack during the separation process and may become unrecoverable. Consequently, replacement of the plates may impact efficiency of the semiconductor manufacturing process.

SUMMARY

Some embodiments of the present disclosure described herein cover a method including electrostatically securing a substrate during a process using a plurality of clamp electrodes of a substrate support to electrostatically secure a substrate during a process. The method further includes actively discharging a residual charge from the substrate after completion of the process based on at least one of contacting a backside of the substrate with a conductive lift pin or exposing the substrate to ultraviolet light. The method further includes lifting the substrate off of the substrate support after the discharging of the residual charge.

Some embodiments of the present disclosure described herein cover a system including a process chamber and a substrate support mounted in the process chamber. The substrate support includes a plurality of clamp electrodes to electrostatically secure a substrate during a process, and one or more components to actively discharge a residual charge from the substrate after completion of the process. The one or more components may include at least one of one or more conductive lift pins to contact a backside of the substrate, or one or more light sources to expose the substrate to ultraviolet light. The substrate support may further include a plurality of lift pins to lift the substrate off of the substrate support after discharging the residual charge. The plurality of lift pins may include the one or more conductive lift pins.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 4A-4C depict sectional side views of embodiments of a system for actively discharging a residual charge from a substrate, according to one or more embodiments of the disclosure;

DETAILED DESCRIPTION OF EMBODIMENTS

Figure 1:
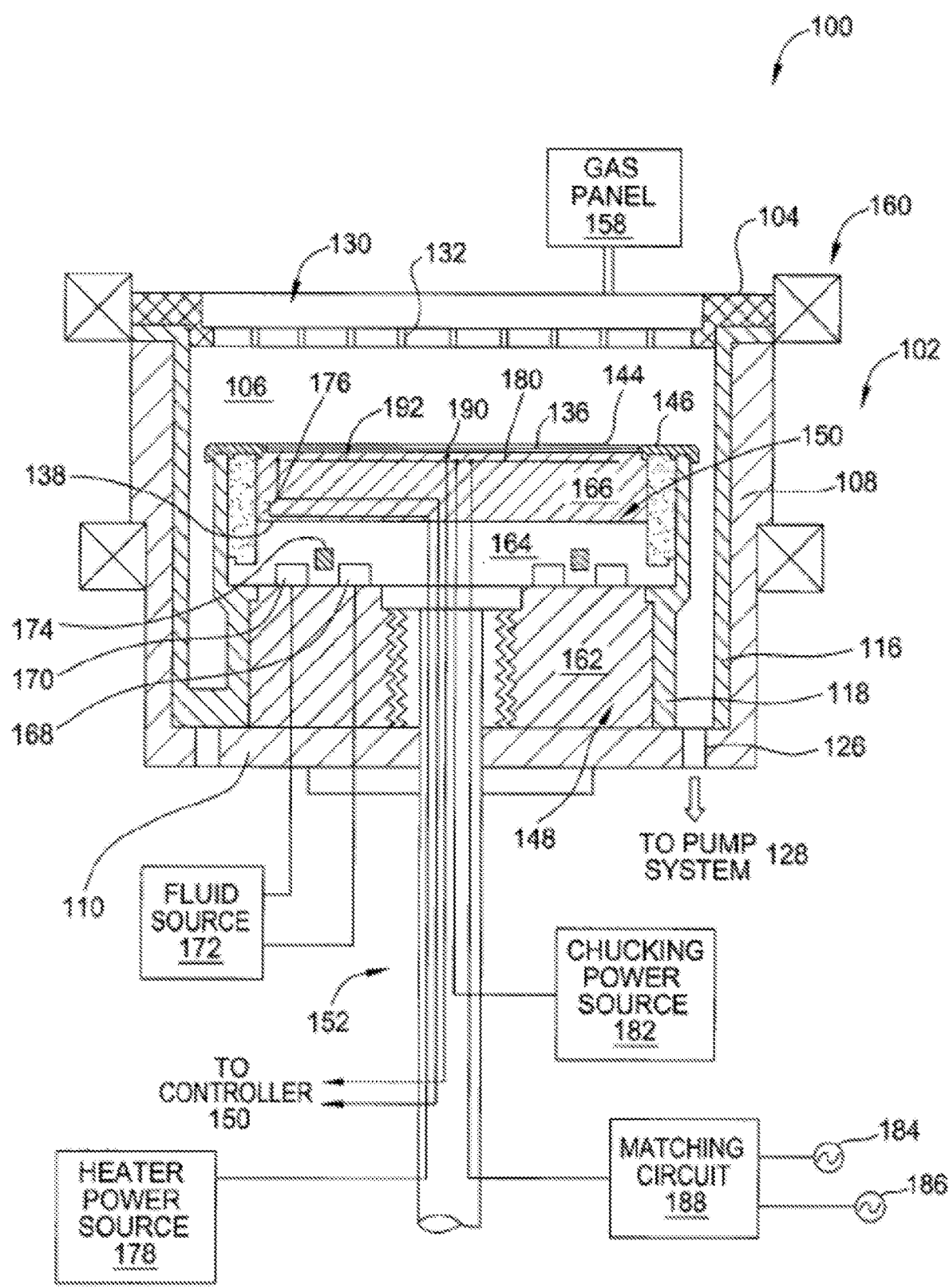
FIG. 1 depicts a sectional side view of one embodiment of a processing chamber, according to one or more embodiments of the disclosure.

Embodiments of the present disclosure provide systems and methods for separating a substrate from a substrate support by actively discharging a residual charge on the substrate. Conventional substrate supports (e.g., electrostatic chucks) use a single electrode to "chuck" or clamp the substrate against the substrate support. However, recently a greater number of electrodes (e.g., bipolar, tripolar, etc.) are being used to clamp the substrate against the substrate support. These multi-polar electrodes have two or more clamping electrodes having opposite polarity. When substrates are separated from substrate supports having multi-polar electrodes (e.g., bipolar, tripolar, etc.), there is a risk of the substrate cracking due to development of residual substrate charge due to forces exerted on the substrate to separate the substrate from the electrostatic chuck. Additionally, during declamping charged particles present in the plasma chamber may be attracted to the substrate due the residual charge on the substrate, which may result in defects in the integrated circuit (IC) being produced. The residual charge may cause inefficient declamping, defocusing issue on subsequent lithography steps, and may also attract foreign particles, impacting yield of the process. This problem is particularly noticeable in high resistivity substrates such as glass or silicon on insulator (SOI). Accordingly, effectively eliminating residual charge in a process chamber may result in a defect free process and may result in higher quality ICs.

Embodiments of the present disclosure provide methods for separating a substrate from a substrate support by actively discharging a residual charge on the substrate. The method includes raising a plurality of lift pins in the substrate support to contact a bottom surface of the substrate, and measuring a force upon contact of the lift pins with the substrate surface. The force may be measured using force sensors that may be installed on a tip of one or more lift pins, or using force sensors that may be installed within a body of one or more lift pins. If the measured force is within a threshold range, then the lift pins are raised to separate the substrate from the substrate support. However, if the force is greater than the threshold range, then there is an indication that there is some residual charge on the substrate. The residual charge may be discharged using one or more methods disclosed.

In some embodiments, a voltage supplied to the clamp electrodes may be reversed and/or a voltage supplied to the clamp electrodes may be modified (e.g., increased) in order to discharge the residual charge on the substrate and/or to repel particles from the substrate. Altering the voltage of the clamp electrodes can include any method including but not limited to deterministic or stochastic, convex or non-convex optimization (e.g., using Newton Ralphson, Runge-Kutta, particle swarm optimization, etc.), etc. In some embodiments, a radiation source (e.g., one or more UV lights) may be used to direct UV light to a bottom surface of the substrate to discharge the residual charge on the substrate. In some embodiments, a separate radiation source (e.g., one or more UV lights) may be installed in the process chamber to direct UV light to a top surface of the substrate to discharge the residual charge on the substrate. In some embodiments, one or more conductive sleeves or pins (e.g., including Al, W, Ti, or highly doped Si, SiC, sapphire, single crystalline oxynitride, etc.) may be used to contact a bottom surface of the substrate to actively discharge the residual charge on the substrate and to enable efficient declamping of the substrate from the substrate support. In some embodiments, the lift pins may be coated with a conductive material to neutralize and/or minimize the residual charge on the substrate. In some embodiments, a conductive sleeve may be used to neutralize and/or minimize the residual charge on the substrate. Some embodiments may involve a combination of two or more methods described here.

Some embodiments relate to a machine learning model that may be used in a controller configured to control movement of the lift pins. The machine learning model may be used to determine the amount of residual charge on the substrate based on a force sensed by the force sensors. The machine learning model may be trained using data from one or more sensors, for example, the force sensed by the lift pins upon contact with the substrate, and/or the clamp voltages being applied to declamp the substrate from the substrate support. Other parameters that may be used in training the machine learning model may include electrostatic chuck parameters such as dielectric thickness, electrode spacing, mesa heights, gas type/flow etc., process parameters such as process duration, gas flows, etc., and chamber parameters such as a liner thickness, material properties, etc. In some embodiments, the machine learning model may be trained on a relationship between the force sensed by the force sensor and the corresponding residual charge on the substrate. The residual charge on the substrate can be sensed using terminals connected to the clamp electrodes or by measuring current leakage through the ESC or process chamber walls. Additionally, residual charge in the wafer can be sensed by a force sensor that may be mounted on the tip of the lift pin, by the torque of the motor actuating the lift pin, or through a sense electrode embedded in the ESC. In some embodiments, the plasma in the process chamber may be powered on while neutralizing and/or minimizing residual charge on the substrate. In some embodiments, the plasma in the process chamber may be powered off while neutralizing and/or minimizing residual charge on the substrate. In some embodiments, if all the electrodes are of the same polarity, then plasma may be turned on for declamping.

Advantages of the disclosed embodiments include applicability to all single electrode and multi-electrode (e.g., bipolar, tripolar, etc.) configurations of a substrate support used to clamp the substrate against the substrate support. The methods disclosed may reduce or eliminate the risk of the substrate cracking due to residual substrate charge that causes a force exerted on a substrate to separate the substrate from a substrate support to exceed a threshold amount that causes such cracking. The methods disclosed also provide efficient declamping, eliminate or reduce defocusing issue on subsequent lithography steps, and/or eliminate or reduce foreign particles that may impact yield of the process. The systems and methods disclosed effectively eliminate residual charge in a substrate, potentially resulting in a defect free process and result in higher quality ICs.

FIG. 1 is a sectional view of one embodiment of a processing chamber 100 having a substrate support assembly 150 (also referred to as a "substrate support") disposed therein. The processing chamber 100 may be any type of processing chamber, such as a deposition chamber, an etch chamber, an oxidation chamber, an implant chamber, and so on. While the substrate support assembly 150 is described as being an electrostatic chuck assembly or a heater assembly in some embodiments, the substrate support assembly may be replaced with other types of substrate support assemblies, such as a vacuum chuck assembly, a deposition heater assembly, a mechanical chuck assembly, a magnetic chuck assembly, a piezoelectric chuck assembly, a wafer carrier chuck assembly, an edge grip chuck assembly, a heated chuck assembly, a coolant chuck assembly, and so on. In one embodiment, the substrate support assembly 150 includes a puck assembly (also referred to as a chuck) 166 including one or more puck plates. Each puck plate may include zero or more different functional elements of the substrate support assembly (e.g., clamp electrodes, radiofrequency (RF) electrodes, main heating electrodes, auxiliary heating electrodes, cooling channels, and so on). The substrate support assembly 150 may further include a cooling plate 164, which may be formed from a metal or a dielectric material (e.g., ceramic). The puck assembly 166 and the cooling plate 164 may be bonded by a bonding layer including a metal, an organic material, a polymer, or combinations thereof.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 or nozzle that may be part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, the substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 150 is part of a greater assembly 148 that includes the substrate support assembly 150 as well as a mounting plate 162 supporting a pedestal 152. In one embodiment, the substrate support assembly 150 further includes a thermally conductive base referred to herein as a cooling plate 164 coupled to a puck assembly (also referred to as a puck plate assembly) 166. In one embodiment, the cooling plate 164 may be coupled to the puck assembly 166 using a dielectric material and/or by a bonding layer. The substrate support assembly 150 described in embodiments may be used for Johnsen-Rahbek and/or Coulombic electrostatic chucking of substrates in embodiments. The substrate support assembly 150 may additionally or alternatively be used as a heater, such as a deposition heater that is configured to heat a support substrate 144 during a deposition process.

In one embodiment, a protective ring 146 is disposed over a portion of the puck assembly 166 at an outer perimeter of the puck assembly 166. In one embodiment, the puck assembly 166 (or one or more plates of the puck assembly 166) is coated with a protective layer 136. Alternatively, the puck assembly 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZrxO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

In some embodiments, the puck assembly 166 is a single monolithic ceramic puck plate. In some embodiments, the puck assembly 166 may include an upper puck plate (not shown) and a lower puck plate (not shown) bonded by a metal and/or organic bond. In one embodiment, the puck assembly 166 and/or the cooling plate 164 is composed of materials usable from about 20° C. to about 500° C. In one embodiment, the puck assembly 166 includes AlN, $Al_2O_3$, or another ceramic. The puck assembly 166 may be undoped or may be doped. For example, the AlN or $Al_2O_3$ may be doped with Samarium oxide ($Sm_2O_3$), Cerium oxide ($CeO_2$), Titanium dioxide ($TiO_2$), or a transition metal oxide. In one embodiment, the puck assembly 166 may include $Al_2O_3$. The $Al_2O_3$ puck assembly 166 may be undoped or may be doped. For example, the $Al_2O_3$ may be doped with Titanium dioxide ($TiO_2$) or a transition metal oxide. The puck assembly 166 may have a coefficient of thermal expansion (CTE) and/or thermal conductivity that is matched or close to that of the cooling plate 164.

In one embodiment, one or more plates of the puck assembly 166 is Molybdenum. Molybdenum may be used, for example, if the puck assembly 166 is to be used in an inert environment. Examples of inert environments include environments in which inert gases such as Ar, $O_2$, N, etc. are flowed. Molybdenum may be used, for example, if the puck assembly 166 is to chuck a substrate for metal deposition. Molybdenum may also be used for the cooling plate 164 for applications in a corrosive environment (e.g., etch applications). In such an embodiment, exposed surfaces of the puck assembly 166 and/or the cooling plate 164 may be coated with a plasma resistant coating. The plasma coating may be performed via a plasma spray process. The plasma resistant coating may cover, for example, side walls of the cooling plate and an exposed horizontal step of the cooling plate. In one embodiment, the plasma resistant coating is Al₂O₃. Alternatively, the plasma resistant coating may be Y₂O₃ or a Y₂O₃ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck assembly 166. The cooling plate 164 and/or puck assembly 166 may include one or more optional embedded heating elements 176, optional embedded thermal isolators 174 optional conduits 168, 170 to control a lateral temperature profile of the substrate support assembly 148, and/or other functional elements. In embodiments, different functions of the puck assembly 166 may be divided across multiple plates. For example, one plate may include RF electrodes, one plate may include primary heating electrodes, one plate may include auxiliary heating electrodes, and so on. In some embodiments, multiple functions are provided by a single plate. For example, one plate of puck assembly 166 may include RF electrodes, clamp electrodes, and/or heating electrodes. In one embodiment, a thermal gasket 138 and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck assembly 166. The conduits 168, 170 and embedded heating elements 176 may be utilized to control the temperature of the puck assembly 166, consequently heating and/or cooling the puck assembly 166 and a substrate (e.g., a wafer) being processed. In one embodiment, the puck assembly 166 includes two separate heating zones that can maintain distinct temperatures. In another embodiment, the puck assembly 166 includes four or more different heating zones that can maintain distinct temperatures. The temperature of the puck assembly 166 and the thermally conductive base 164 may be monitored using multiple temperature sensors 190, 192, which may be monitored using a controller 195. The temperature sensors 190, 192 may be included in one plate of puck assembly 166 and/or in multiple plates of the puck assembly 166, which may be a same plate or plates or different plate or plates from the plate(s) containing the heating elements 176.

The puck assembly 166 may further include multiple gas passages such as grooves, mesas and other surface features that may be formed in an upper surface of a topmost plate of the puck assembly 166. The gas passages may be fluidly coupled to a source of a heat transfer (or backside) gas, such as He via holes drilled in the plates of the puck assembly 166. In operation, the backside gas may be provided at controlled pressure into the gas passages to enhance the heat transfer between the puck assembly 166 and the substrate 144.

In one embodiment, the puck assembly 166 include one or more clamping electrodes 180 controlled by a chucking power source 182. The clamping electrodes 180 may be used to clamp the wafer to the puck assembly 166. In one embodiment, a different RF electrode or set of electrodes are connected to one or more RF power sources 184, 186 and used for maintaining a plasma. The RF electrode(s) may be included in one plate of puck assembly 166. The one or more RF power sources 184, 186 may be capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

In some embodiments, the puck assembly 166 and the dielectric cooling plate 164 can be bonded using a bonding layer including Ni, Ti, C, Si, a flexible graphite layer, an organic elastomer, Al, In, Ni, Ti, and/or an alloy including Ni—Ti or Mo—Mg, or Cu—Ag or Al alloy.

Figure 2A:
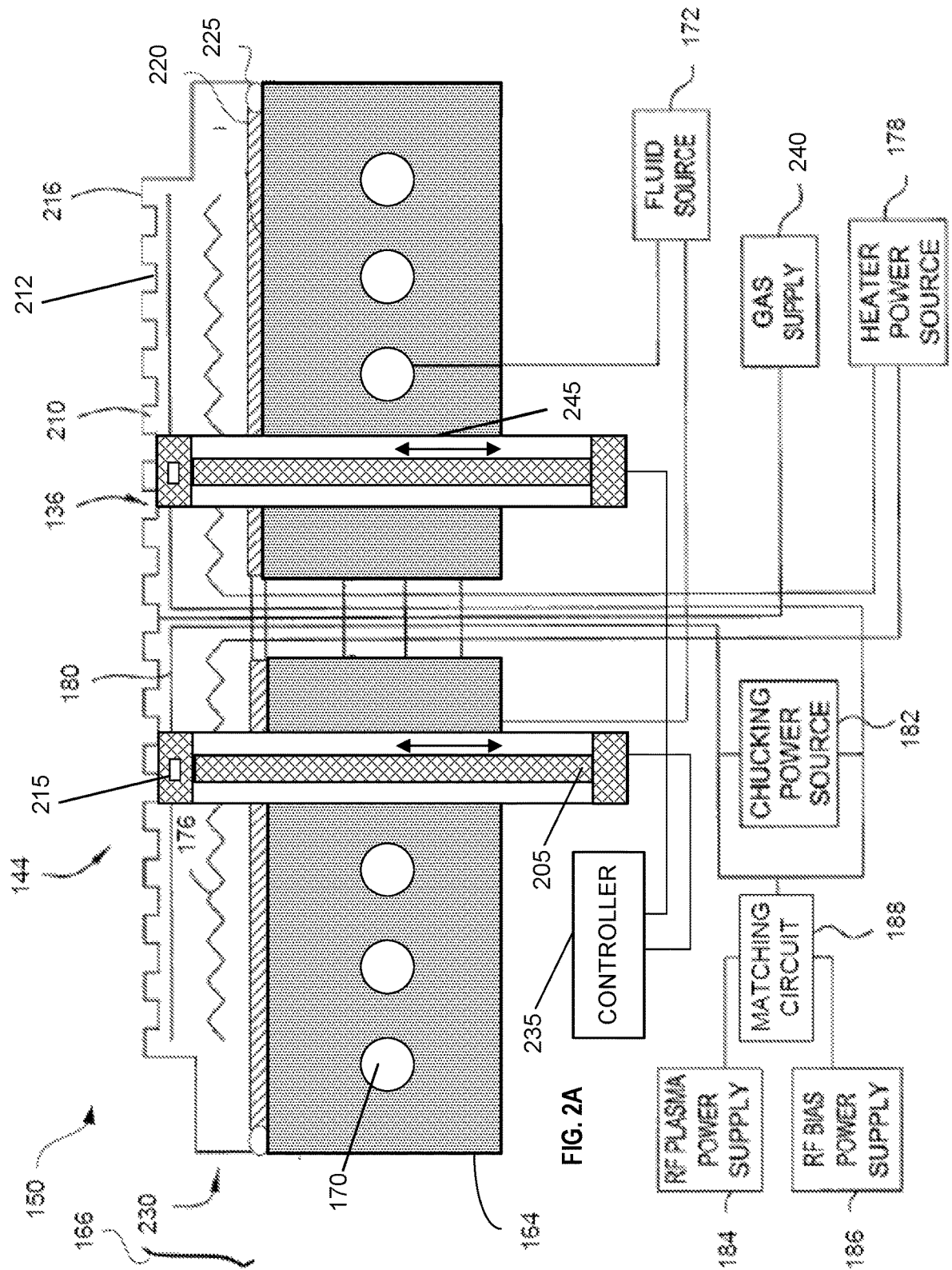
FIG. 2A depicts a sectional side view of one embodiment of a substrate support, according to one or more embodiments of the disclosure.

FIG. 2A depicts a sectional side view of one embodiment of a substrate support assembly 150. The substrate support assembly 150 includes a puck assembly 166 including one or more puck plates, such as two plates, three plates, four plates, five plates, and so on. In some embodiments, the puck assembly 166 may include a single puck plate 230. Puck plate 230 may be permanently bonded to the cooling plate 164 using a bonding layer 220. Different techniques may be used to bond the puck plate 230 to the cooling plate 164. One technique that may be used for bonding is metal bonding. Polymer bonding, diffusion bonding, organic bonding, and so on may also be performed to bond plates together. In one embodiment, diffusion bonding is used as a method of metal bonding the plate 230 to the cooling plate 164. One or more o-rings 225 may surround bonding layer 220 to protect the bonding layer 220 contained between the puck plate 232 and cooling plate 164. In other embodiments, puck plate 230 may be coupled to cooling plate 164 via fasteners, a spring mechanism, and/or other types of coupling mechanisms.

The puck plate 230 may include mesas 210, channels 212 and optionally an outer ring 216. In one embodiment, the puck plate 230 includes functional elements such as one or more clamping electrodes 180, one or more heating elements 176, and/or one or more RF electrodes (not shown). Alternatively, the clamping electrodes 180, heating elements 176, and RF electrodes may be disposed in different plates. The clamping electrodes 180 may be coupled to a chucking power source 182, and/or to an RF plasma power supply 184 and/or an RF bias power supply 186 via a matching circuit 188. The puck plate 230 may additionally include gas delivery holes (not shown) through which a gas supply 240 pumps a backside gas such as He. Additionally, the puck plate 230 may additionally include one or more cooling holes (not shown) for a cooling fluid to flow therethrough.

The puck plate 230 may have a thickness of about 1-25 mm or more in embodiments. The clamping electrodes 180 may be located about 0.25 mm from an upper surface of the puck plate 230, the heating elements 176 may be located about 1 mm under the clamping electrodes 180, and RF electrodes may be located about 0.5 mm under the heating elements 176 in one example. The heating elements 176 may be screen printed heating elements having a thickness of about 10-200 microns in some embodiments. Alternatively, the heating elements may be resistive coils that use about 1-3 mm of thickness of the puck plate 230 in some embodiments. In such an embodiment, the puck plate 230 may have a minimum thickness of about 5 mm. In some embodiments, the puck plate may have thicknesses ranging from 1 mm to 10 mm, 2 mm to 8 mm, or other thicknesses.

The heating elements 176 are electrically connected to a heater power source 178 for heating the puck plate 230. The puck plate 230 may include electrically insulative materials such as AlN. In one embodiment, the puck plate 230 is composed of a metal matrix composite material. In one aspect, the metal matrix composite material includes aluminum and silicon. In one embodiment, the metal matrix composite is a SiC porous body infiltrated with an AlSi alloy.

The puck plate 230 is coupled to and in thermal communication with a cooling plate 164 having one or more conduits 170 (also referred to herein as cooling channels) in fluid communication with fluid source 172. In one embodiment, the cooling plate 164 is coupled to the puck plate 232 using a dielectric material (e.g., a ceramic layer). Larger separation may decrease heat transfer, and cause the interface between the puck assembly 166 and the cooling plate 164 to act as a thermal choke. In one embodiment, a conductive gas may be flowed into the conduits 170 to improve heat transfer between the puck assembly 166 and the cooling plate 164. In some embodiments, an o-ring or gasket 225 is not used between puck assembly 166 and cooling plate 164. In some embodiments, a separation between puck assembly 166 and cooling plate 164 minimizes the contact area between the puck assembly 166 and the cooling plate 164.

In one embodiment (not shown), a grafoil layer or other flexible graphite layer is disposed between the puck assembly 166 and the cooling plate 164. The flexible graphite may have a thickness of about 10-40 mil. The flexible graphite may be thermally conductive, and may improve a heat transfer between the puck assembly 166 and the cooling plate 164.

In one embodiment, the cooling plate 164 includes a base portion (not shown). In one embodiment, the cooling plate 164 includes a spring loaded inner heat sink connected to the base portion by one or more springs. The springs apply a force to press the inner heat sink against the puck assembly 166. A surface of the heat sink may have a predetermined roughness and/or surface features (e.g., mesas) that control heat transfer properties between the puck assembly 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

In one embodiment, the substrate support assembly 150 may have one or more through holes 245 in which one or more lift pins 205 may be housed. The lift pins 205 may be used to separate or declamp a wafer from the substrate support assembly 150. In some embodiments, the lift pins 205 may be actuated by a linear actuator (not shown). In some embodiments, the lift pins 205 may be actuated by a stepper motor (not shown). In some embodiments, the movement of the lift pins 205 may be controlled by a controller 235, which may control the actuator or stepper motor driving the lift pins 205. When the lift pins 205 are actuated, the lift pins 205 may be raised to contact a bottom surface of a wafer clamped on the substrate support assembly 150. When the lift pins 205 are deactivated, they may be retracted (lowered) to be housed in the through holes 245.

In some embodiments, the lift pins 205 may be made of graphite. In some embodiments, the lift pins 205 may be made of a conductive material (e.g., Al, W, Ti, or highly doped Si, SiC, sapphire, single crystalline oxynitride, etc.). In some embodiments, the lift pins 205 are coated with a conductive layer. In some embodiments, the lift pins 205 may include one or more force sensors 215 to measure a force exerted by the wafer on the lift pin 205 contacting the wafer. The force sensors 215 may include any type of force sensor including but not limited to pressure sensors, (microelectromechanical systems) MEMS sensors, or any other sensor having a transducer to measure force. The transducer may be resistive, capacitive, or inductive in nature. When a wafer or substrate is to be separated from the substrate support assembly, the lift pins 205 in the substrate support assembly 150 may be raised to contact a bottom surface of the substrate. The force sensors 215 measure a force upon contact of the lift pins with the substrate surface. The force may be measured using force sensors 215 that may be installed on a tip of one or more lift pins, or using force sensors that may be installed anywhere within a body of one or more lift pins 205. If the measured force is within a threshold range, then the lift pins 205 are further raised to a first height to separate the substrate from the substrate support assembly 150. However, if the force is greater than the threshold range, then there is an indication that there is some residual charge on the substrate. The residual charge may be discharged using one or more methods described with respect to FIGS. 3A-8 below prior to lifting the substrate from the substrate support.

In some embodiments, a voltage supplied to the clamp electrodes 180 may be reversed and/or a voltage supplied to the clamp electrodes 180 may be modified (e.g., increased) in order to discharge the residual charge on the substrate. Altering the voltage of the clamp electrodes 180 can include any method including but not limited to deterministic or stochastic, convex or non-convex optimization (e.g., using Newton Ralphson, Runge-Kutta, particle swarm optimization, etc.), etc. In some embodiments, one or more conductive sleeves or pins (e.g., including Al, W, Ti, or highly doped Si, SiC, sapphire, single crystalline oxynitride, etc.) may be used to contact a bottom surface of the substrate to actively discharge the residual charge on the substrate and to enable efficient declamping of the substrate from the substrate support. In some embodiments, the lift pins 205 may formed from and/or be coated with a conductive material to neutralize and/or minimize the residual charge on the substrate on contact. In some embodiments, a conductive sleeve (not shown) may be used to neutralize and/or minimize the residual charge on the substrate. Some embodiments may involve a combination of two or more methods described here.

Figure 9:
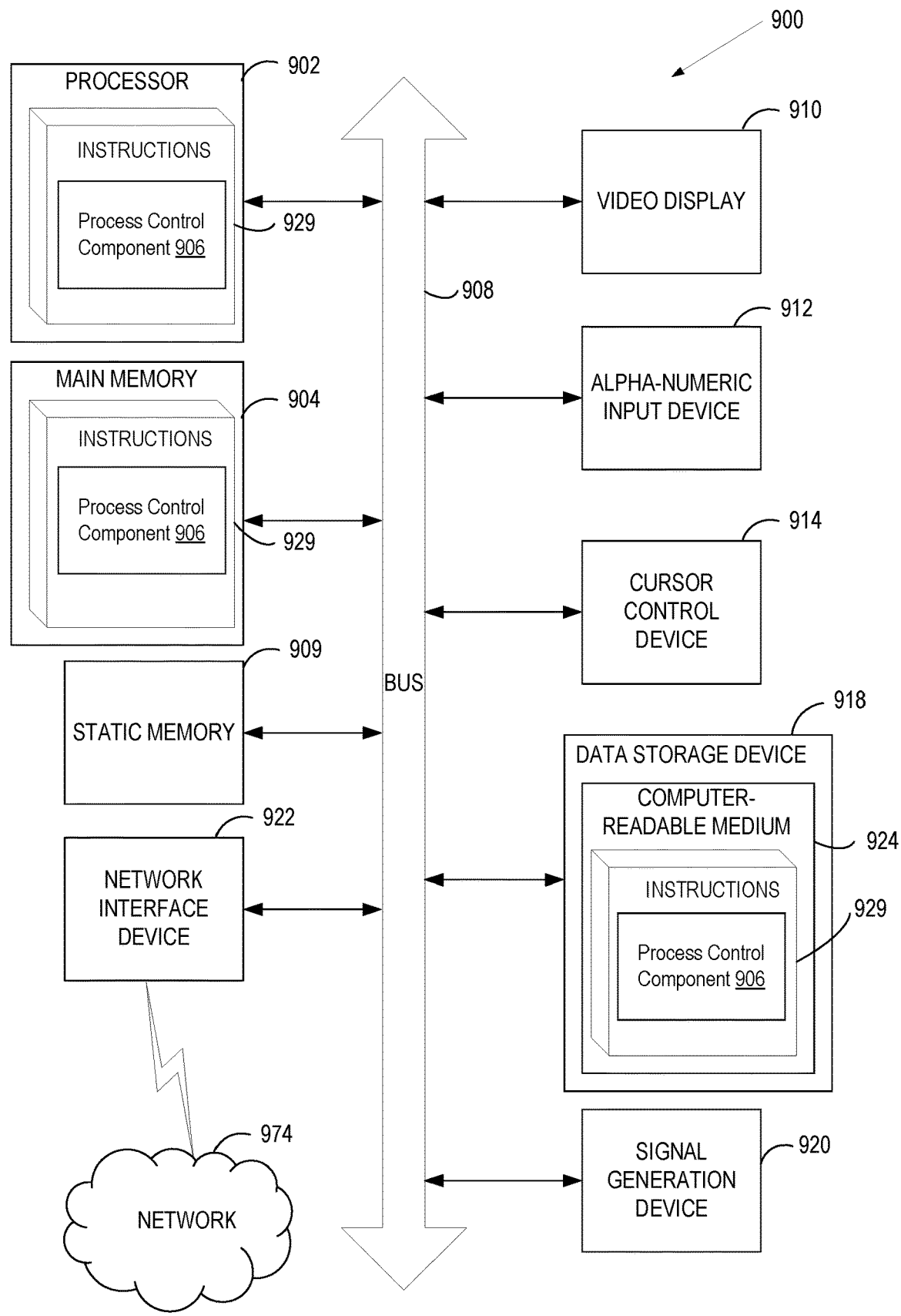
FIG. 9 is a block diagram illustrating a computer system, according to one or more embodiments of the disclosure.

In some embodiments, the lift pins 205 may be operatively coupled to and controlled by a controller 235, which is described in further detail with respect to FIG. 9. Some embodiments relate to a machine learning model that may be used by the controller 235 to control movement of the lift pins 205 based on the residual charge on the substrate. The machine learning model may be used to determine the amount of residual charge on the substrate based on the force sensed by the force sensors. The machine learning model may be trained using data generated by one or more sensors, for example, the force sensed by the force sensors 215 upon contact with the substrate, and/or the clamp voltages being applied to declamp the substrate from the substrate support. Other parameters that may be used in training the machine learning model may include electrostatic chuck parameters such as dielectric thickness, electrode spacing, mesa heights, gas type/flow etc., process parameters such as process duration, gas flows, etc., and chamber parameters such as a liner thickness, material properties, etc. In some embodiments, the machine learning model may be trained on a relationship between the force sensed by the force sensors 215 and the corresponding residual charge measured on the substrate. The residual charge on the substrate can be sensed using terminals connected to the clamp electrodes 180 or by measuring current leakage through the ESC or process chamber walls. Additionally, residual charge in the wafer can be sensed by a force sensor 215 that may be mounted on the tip of the lift pin, by the torque of the motor actuating the lift pin, or through a sense electrode embedded in the ESC.

Figure 2B:
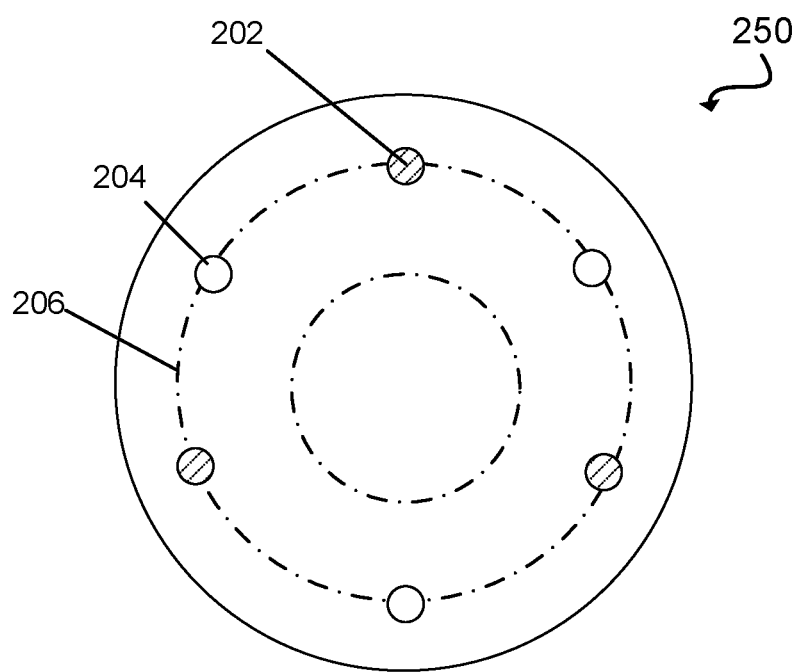
FIGS. 2B-2C depict a top view of embodiments of a substrate support, according to one or more embodiments of the disclosure.

FIG. 2B depicts a top view of one embodiment of a substrate support 250, according to one or more embodiments of the disclosure. Substrate support 250 includes three or more conductive lift pins 202, which may be placed at different locations along a circle 206 that is concentric with the circumference of the substrate support 250. Additionally, substrate support 250 may include three or more non-conductive lift pins 204, which may be placed at different locations along the circle 206. In some embodiments, each of the lift pins 202, 204 may be individually controlled using one or more motors. In some embodiments, each of the lift pins 202, 204 may be raised to the same height. In some embodiments, each of the lift pins 202, 204 may be raised to different heights. For example, conductive lift pins 202 may be raised to a first height and non-conductive lift pins 204 may be raised to a second height that may be different from the first height as some incoming wafer with bow may benefit from raising or lowering lift pins to different heights. The order in which the lift pins 202, 204 may be raised or lowered can be determined or depend on one or more factors such as the state of the incoming wafer shape, material of the wafer, process parameters, ESC sensed signals, or a combination thereof. This may be helpful in managing a bow or warped wafer as the bow can be as high as 3 mm in some cases. A bow is the deviation of the center point of the median surface of a free, un-clamped wafer from a reference plane, where the reference plane is defined by three corners of an equilateral triangle. A warp is the difference between the maximum and the minimum distances of the median surface of a free, un-clamped wafer from the same reference plane. Bow and warp may cause substrates to have poor contact with an ESC, and/or may cause some parts of the substrate to not be in contact with the ESC while other parts of the substrate are in contact with the ESC. By raising different lift pins to different heights, contact may be made between lift pins and areas of the warped and/or bowed substrate despite the bow and/or warp. In some embodiments, different conductive lift pins and/or different non-conductive lift pins are raised to different heights.

Conductive lift pins 202 may have a conductive body made of a conductive material. Alternatively, the conductive lift pins 202 may include sleeves that may be made of a conductive material, and the body may be made from a non-conductive material. Although the size of the holes for different lift pins 202, 204 is illustrated to be the same, the holes through which the lift pins may be raised may have different diameters. Conductive lift pins 202 assist in dissipating any residual charge from an incoming wafer when the conductive lift pins 202 are used to position the wafer onto the substrate support 250. This operation of receiving the incoming wafer using conductive lift pins 202 may also prevent attraction of any electrostatic charges on the wafer and the ESC itself.

Figure 2C:
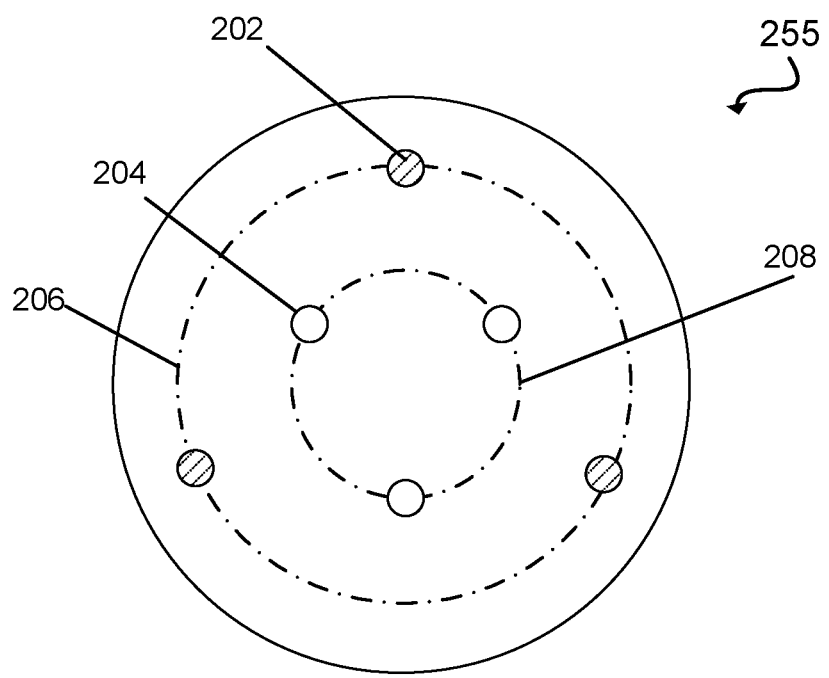

FIG. 2C depicts a top view of one embodiment of a substrate support 255, according to one or more embodiments of the disclosure. Substrate support 255 includes three or more conductive lift pins 202, which may be placed at different locations along a circle 206 that is concentric with the circumference of the substrate support 255. Additionally, substrate support 255 may include three or more non-conductive lift pins 204, which may be placed at different locations along a circle 208, which may have a diameter smaller than the circle 206. In some embodiments, each of the lift pins 202, 204 may be individually controlled using one or more motors. In some embodiments, each of the lift pins 202, 204 may be raised to the same height. In some embodiments, each of (or one or more of) the lift pins 202 and/or lift pins 204 may be raised to different heights. For example, conductive lift pins 202 may be raised to a first height and non-conductive lift pins 204 may be raised to a second height that may be different from the first height as some incoming wafer with bow may require raising or lowering lift pins to different heights. In another example, different conductive lift pins 204 may be raised to different heights from one another and/or different non-conductive lift pins 202 may be raised to different heights from one another. The order in which the lift pins 202, 204 may be raised or lowered can be determined or depend on one or more factors such as the state of the incoming wafer shape, material of the wafer, process parameters, ESC sense signals, or a combination thereof. This may be helpful in managing a bow or warped wafer as the bow can be as high as 3 mm in some cases.

Figure 3A:
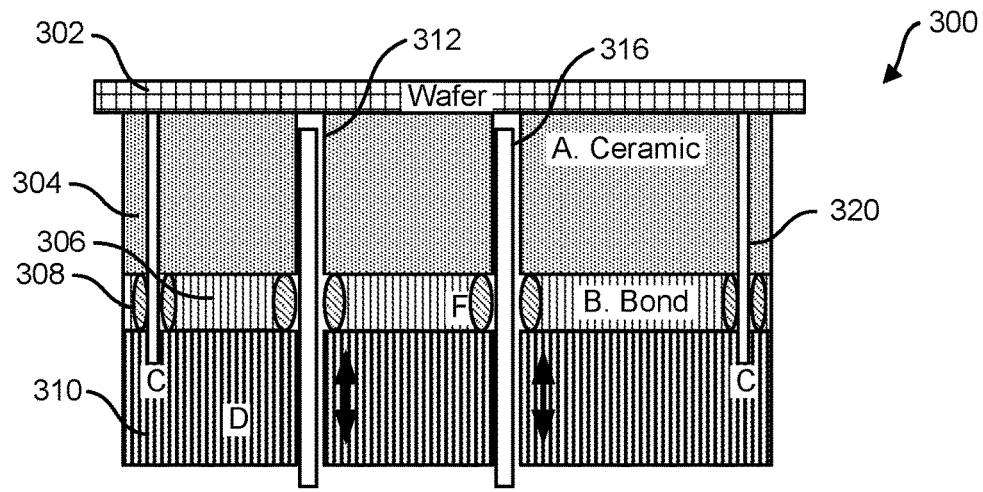
FIGS. 3A-3C depict sectional side views of embodiments of a system for actively discharging a residual charge from a substrate, according to one or more embodiments of the disclosure.
Figure 3B:
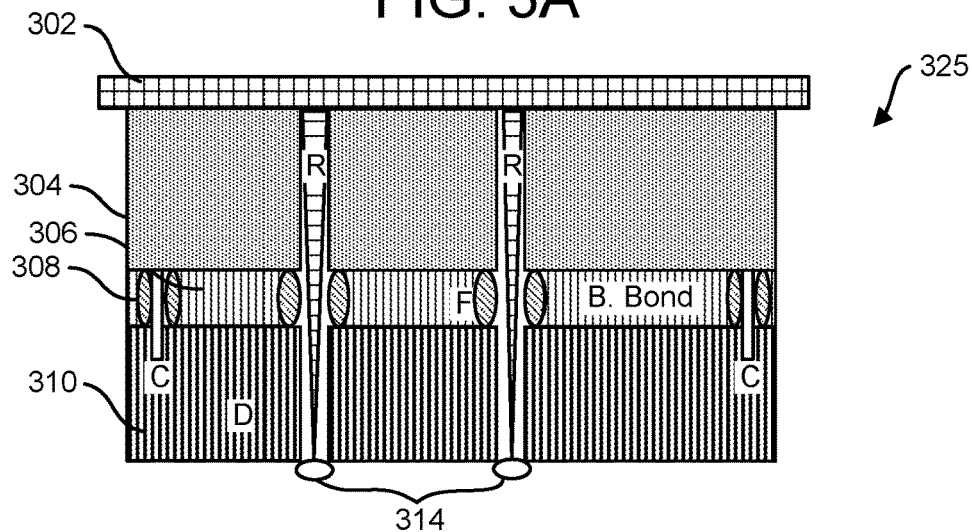
Figure 3C:
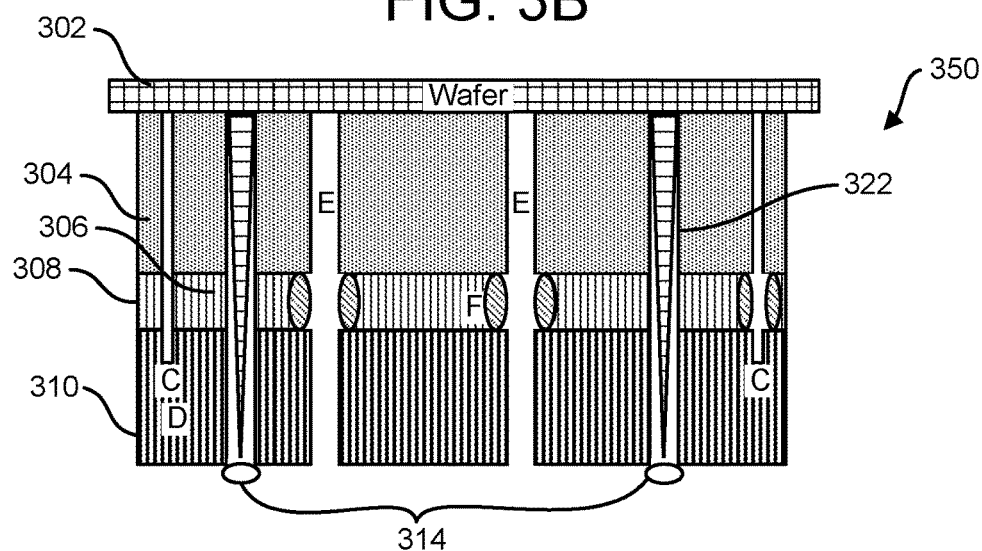

FIGS. 3A-3C depict sectional side views of embodiments of a substrate support 300 for actively discharging a residual charge from a substrate, according to one or more embodiments of the disclosure. The substrate support 300 may be a vacuum chuck, an electrostatic chuck, a mechanical chuck, a magnetic chuck, a piezoelectric chuck, a wafer carrier chuck, an edge grip chuck, a heated chuck, or a coolant chuck. In one embodiment, the substrate support 300 may include one or more puck plates 304 including one or more functional elements. The functional elements may include a clamp electrode, a heating element, a zone heater, a pixelated heater, a radio frequency (RF) electrode, a RF filter, a gas channel, a cooling channel, or combinations thereof. In one embodiment, a puck plate 304 may include one or more clamp electrodes, one or more peripheral RF electrodes, one or more heating elements, such as for a zone heater and/or a pixelated heater, and one or more RF electrodes. In some embodiments, the puck plate 304 may include a RF filter to ensure that interference and noise are minimized, reducing any potential impact on the substrate. The substrate support 300 may further include a cooling plate 310 including one or more cooling loops or channels (not shown) to circulate a cooling fluid (e.g., a coolant or a refrigerant or gas) and absorb the heat from the puck plate. The cooling plate 310 may also include one or more gas channels 320 for a gas (e.g., inert gas) to flow therethrough.

The cooling 310 plate may also include one or more vias through which one or more terminals connecting the functional elements within the chuck may be connected to a power source. The ceramic puck plate 304 and the cooling plate 310 may be bonded using a bonding layer 306. The bonding layer 306 may include Ni, Ti, C, Si, a flexible graphite layer, an organic elastomer, Al, In, Ni, Ti, and/or an alloy including Ni—Ti or Mo—Mg, or Cu—Ag or Al alloy. The bonding layer 306 may have a CTE and/or thermal conductivity that is similar or equal to the puck plate 304 and/or cooling plate 310. In some embodiments, the bonding layer 306 may have a CTE and/or thermal conductivity that may be different from the puck plate 304 and/or cooling plate 310. The bonding layer 306 may have vias, through holes, and gas channels that correspond to the vias, through holes, and gas channels formed in the cooling plate 310, respectively, such that a gas (e.g., He) may be pumped to facilitate separation of the substrate 302 from the puck plate 304. One or more o-rings or gaskets 308 may be used to prevent the bonding layer 306 from entering the through holes 312 and/or the vias. Examples of materials that may be used in forming one or more puck plates 304 include niobium, aluminum oxide, aluminum nitride, single crystal alumina, or sapphire. In some embodiments, the puck plate 304 and the cooling plate 310 are bonded using a metal bond. In some embodiments, the substrate support 300 is an electrostatic chuck.

The substrate support 300 may additionally include one or more through holes 312 to accommodate lift pins 316 (similar to lift pins 205 in FIG. 2) that may be engaged to lift a substrate 302 away from the substrate support 300. Similarly, the lift pins 316 may be lowered into the through holes 312 of the substrate support 300 when disengaged. In some embodiments, the lift pins 205 may include one or more force sensors to measure a force exerted by the wafer on the lift pin 316 contacting the wafer. The force sensors may include any type of force sensor including but not limited to pressure sensors, (microelectromechanical systems) MEMS sensors, or any other sensor having a transducer to measure force. The transducer may be resistive, capacitive, or inductive in nature. The lift pins 316 may be driven by one or more servo motors that may be controlled by a controller (e.g., controller 235). When a process has been completed on the substrate 302, the lift pins 316 are raised to contact a bottom surface of the substrate 302. The force sensors in the flit pins 316 measure a force upon contact of the lift pins with the substrate surface. The force may be measured using force sensors that may be installed on a tip of one or more lift pins, or using force sensors that may be installed anywhere within a body of one or more lift pins 316. If the measured force is within a threshold range, then the lift pins 316 are further raised to a first height to separate the substrate 302 from the substrate support assembly 300. However, if the force is greater than the threshold range, then there is an indication that there is some residual charge on the substrate 302, and the lift pins 316 may be retracted.

The controller may use a machine learning model or a control algorithm to control movement of the lift pins 316 based on the residual charge on the substrate 302. The machine learning model may be used to determine the amount of residual charge on the substrate based on the force sensed by the force sensors. The machine learning model may be trained using data generated by one or more sensors, for example, the force sensed by the force sensors upon contact with the substrate, and/or the clamp voltages being applied to declamp the substrate from the substrate support. Other parameters that may be used in training the machine learning model may include electrostatic chuck parameters such as dielectric thickness, electrode spacing, mesa heights, gas type/flow etc., process parameters such as process duration, gas flows, etc., and chamber parameters such as a liner thickness, material properties, etc. In some embodiments, the machine learning model may be trained on a relationship between the force sensed by the force sensors and the corresponding residual charge measured on the substrate. The residual charge on the substrate can be sensed using terminals connected to the clamp electrodes or by measuring current leakage through the ESC or process chamber walls. Additionally, residual charge in the wafer can be sensed by a force sensor that may be mounted on the tip of the lift pin, by the torque of the motor actuating the lift pin, or through a sense electrode embedded in the ESC.

FIG. 3B depicts a sectional side view of a substrate support 325, according to one or more embodiments of the disclosure. The substrate support 325 may include one or more light sources 314 (e.g., LED, laser diode, etc.) to direct light (e.g., UV light) onto a bottom surface of the substrate 302. The radiation from the direct light may be used to neutralize and/or minimize the residual charge on the substrate 302. The light sources 314 may be external to the substrate support 325, or they may be embedded on one or more layers in a body of the substrate 325. For example, the light sources 314 may be embedded under the puck plate 302, the puck plate 302 may include corresponding through holes to allow light from the light sources 314 to strike the substrate. Alternatively, the through holes may be filled with or a portion of the puck plate 302 may be formed from a material that may be transparent to the wavelength and/or frequency of the UV light such that when the light sources 314 are powered on, the light is directed to substrate 302 without any interference. In some embodiments, the light sources 314 may be embedded in a bonding layer 308 of the substrate support 325. In some embodiments, the light sources 314 may be embedded in the cooling plate 310 of the substrate support 325. Alternatively, the substrate support may include dedicated through holes 322 to direct light from light sources 314, as illustrated in the substrate support 350 shown in FIG. 3C.

FIGS. 4A-4C depict sectional side views of various embodiments of lift pins for actively discharging a residual charge from a substrate, according to one or more embodiments of the disclosure. In FIG. 4A, the lift pins 400 may be made of graphite or any non-conductive material, and the light sources 314 (e.g., LED, laser diode, etc.) may be installed on a base or foot of the lift pins 400. Alternatively, the lift pin may be made of a conductive material (e.g., including Al, W, Ti, or highly doped Si, SiC, sapphire, single crystalline oxynitride, etc.), and the light sources 314 may be installed on a base or foot of the lift pins 400. Light sources 314 may direct light (e.g., UV light) onto a bottom surface of the substrate via through holes 312 formed in the substrate support. The radiation from the direct light may be used to neutralize and/or minimize the residual charge on the substrate. In FIG. 4B, the lift pin 425 may be made of graphite or any non-conductive material, and the light sources 314 (e.g., LED, laser diode, etc.) may be installed on a base or foot of the lift pins 425 such that the light source 314 surrounds the lift pins 425. In some embodiments, the light source 314 may include a circular light source. In FIG. 4C, a portion of the lift pin 450 (e.g., the stem) may be formed from a material that may be transparent to the wavelength and/or frequency of the UV light such that when the light sources 314 are powered on, the light is directed to substrate without any interference.

Figure 5:
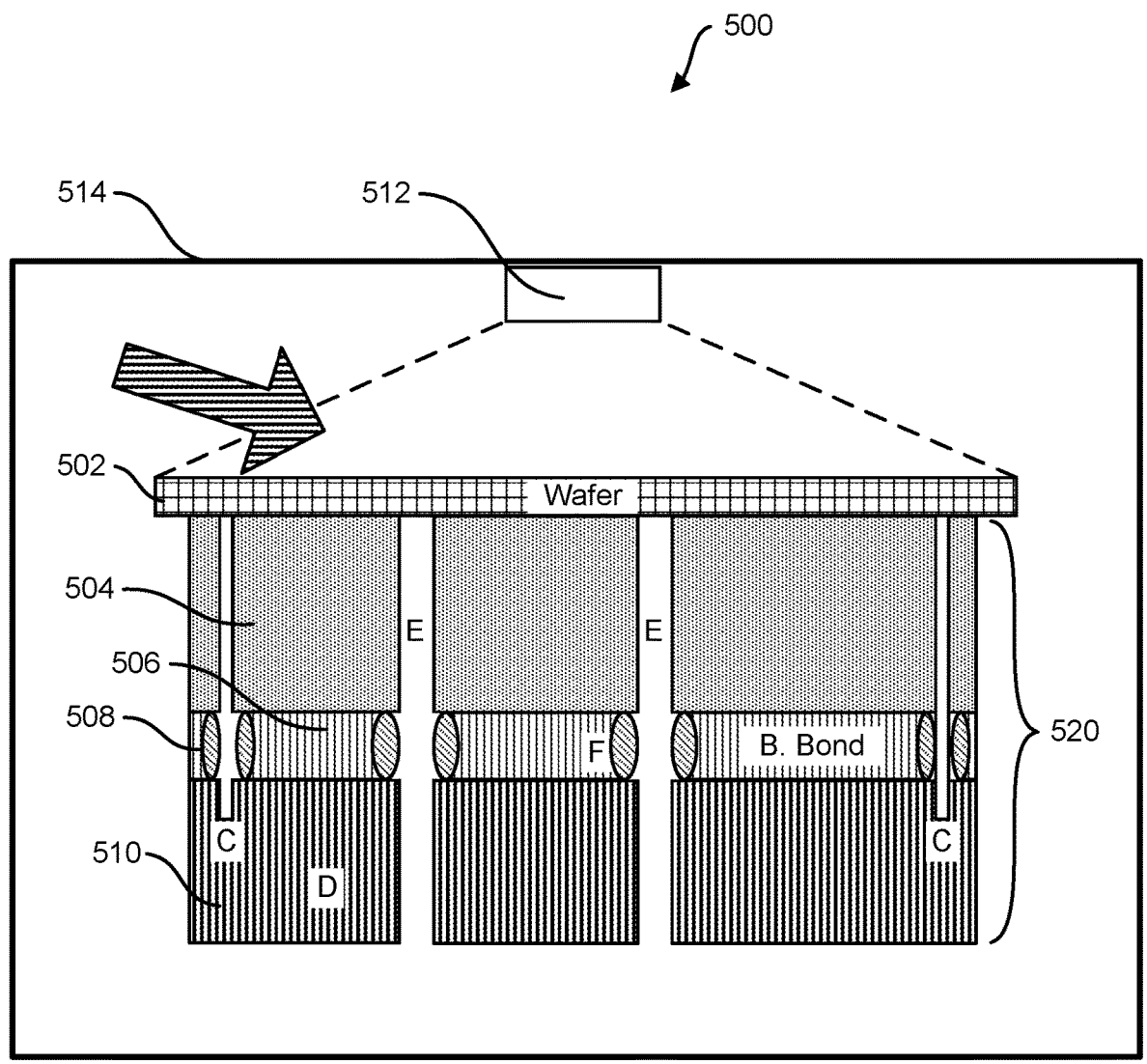
FIG. 5 depicts sectional side views of embodiments of a system for actively discharging a residual charge from a substrate, according to one or more embodiments of the disclosure.

FIG. 5 depicts sectional side view of a system 500 for actively discharging a residual charge from a substrate, according to one or more embodiments of the disclosure. System 500 includes process chamber 514 and a dedicated light source 512 (e.g., LED, laser diode, etc.) that may be installed on one or more walls of the process chamber 514. The light (e.g., UV light) from the light source 512 may be directed onto a top surface of a substrate 502, and the radiation from the direct light may be used to neutralize and/or minimize the residual charge on the substrate 502.

The substrate support 520 may be a vacuum chuck, an electrostatic chuck, a mechanical chuck, a magnetic chuck, a piezoelectric chuck, a wafer carrier chuck, an edge grip chuck, a heated chuck, or a coolant chuck. In one embodiment, the substrate support 520 may include one or more puck plates 504 including one or more functional elements. The functional elements may include a clamp electrode, a heating element, a zone heater, a pixelated heater, a radio frequency (RF) electrode, a RF filter, a gas channel, a cooling channel, or combinations thereof. In one embodiment, a puck plate 504 may include one or more clamp electrodes, one or more peripheral RF electrodes, one or more heating elements, such as for a zone heater and/or a pixelated heater, and one or more RF electrodes. In some embodiments, the puck plate 504 may include a RF filter to ensure that interference and noise are minimized, reducing any potential impact on the substrate. The substrate support 520 may further include a cooling plate 510 including one or more cooling loops or channels (not shown) to circulate a cooling fluid (e.g., a coolant or a refrigerant or gas) and absorb the heat from the puck plate. The cooling plate 510 may also include one or more gas channels for a gas (e.g., inert gas) to flow therethrough.

The ceramic puck plate 504 and the cooling plate 510 may be bonded using a bonding layer 506. The bonding layer 506 may include Ni, Ti, C, Si, a flexible graphite layer, an organic elastomer, Al, In, Ni, Ti, and/or an alloy including Ni—Ti or Mo—Mg, or Cu—Ag or Al alloy. The bonding layer 506 may have a CTE and/or thermal conductivity that is similar or equal to the puck plate 504 and/or cooling plate 510. In some embodiments, the bonding layer 506 may have a CTE and/or thermal conductivity that may be different from the puck plate 504 and/or cooling plate 510. The bonding layer 506 may have vias, through holes, and gas channels that correspond to the vias, through holes, and gas channels formed in the cooling plate 510, respectively, such that a gas (e.g., He) may be pumped to facilitate separation of the substrate 502 from the puck plate 504. One or more o-rings or gaskets 508 may be used to prevent the bonding layer 506 from entering the through holes 512 and/or the vias. Examples of materials that may be used in forming one or more puck plates 504 include niobium, aluminum oxide, aluminum nitride, single crystal alumina, or sapphire. In some embodiments, the puck plate 504 and the cooling plate 510 are bonded using a metal bond. In some embodiments, the substrate support 520 is an electrostatic chuck.

Figure 6A:
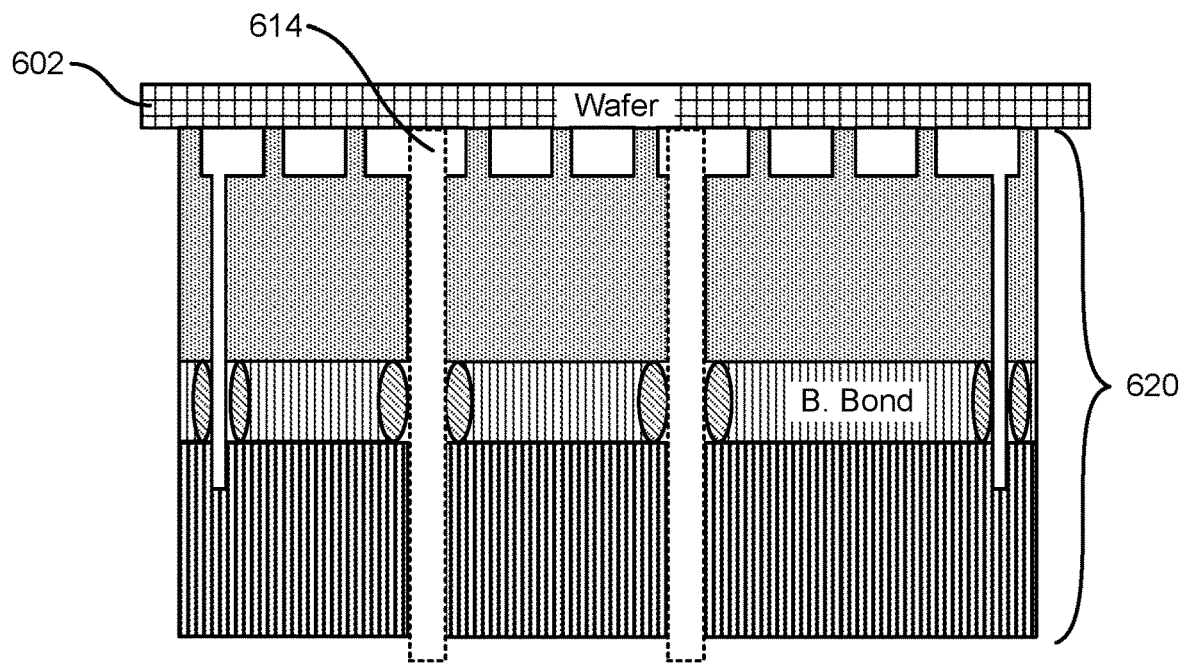
FIGS. 6A-6B depict sectional side views of embodiments of a system for actively discharging a residual charge from a substrate, according to one or more embodiments of the disclosure.
Figure 6B:
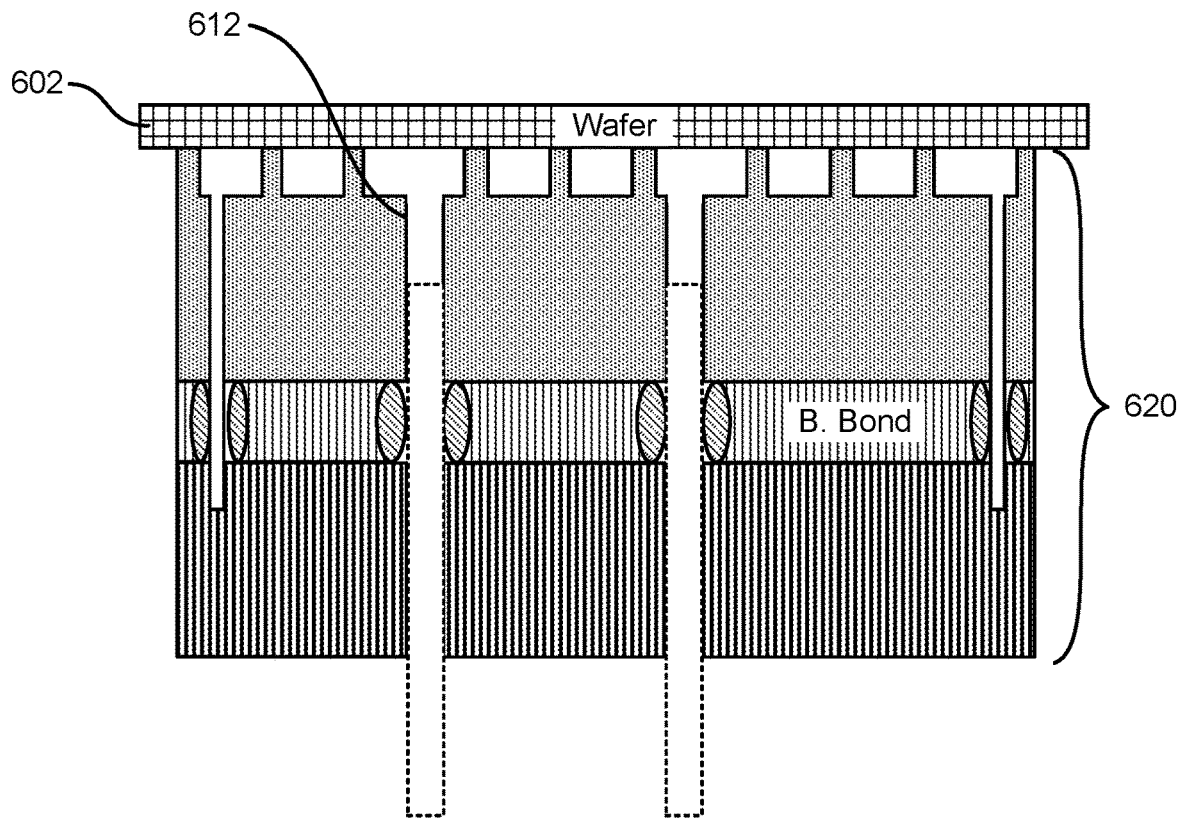

FIGS. 6A-6B depict sectional side views of a substrate support 620 for actively discharging a residual charge from a substrate 602. The substrate support 620 includes one or more through holes 612 to accommodate lift pins 614 (similar to lift pins 205, 316) that may be engaged to lift a substrate 602 away from the substrate support 620. Similarly, the lift pins 614 may be lowered into the through holes 612 of the substrate support 620 when disengaged. The lift pins 614 may be driven by one or more servo motors that may be controlled by a controller (e.g., controller 235). The lift pins 614 may be made of a conductive material (e.g., including Al, W, Ti, or highly doped Si, SiC, sapphire, single crystalline oxynitride, etc.) or they may include a conductive tip that may be made of a conductive material (e.g., including Al, W, Ti, or highly doped Si, SiC, sapphire, single crystalline oxynitride, etc.). Alternatively, the lift pins may be surrounded by a sleeve that may be made of the conductive material and only the sleeve may be raised by the controller when a substrate has to be discharged by a conductive contact. For example, when a process has been completed on the substrate 602, the lift pins 614 and/or the sleeves are raised to contact a bottom surface of the substrate 602 to actively discharge the residual charge on the substrate and to enable efficient declamping of the substrate 602 from the substrate support 620. In some embodiments, the lift pins 614 may be coated with a conductive material to neutralize and/or minimize the residual charge on the substrate.

Figure 7:
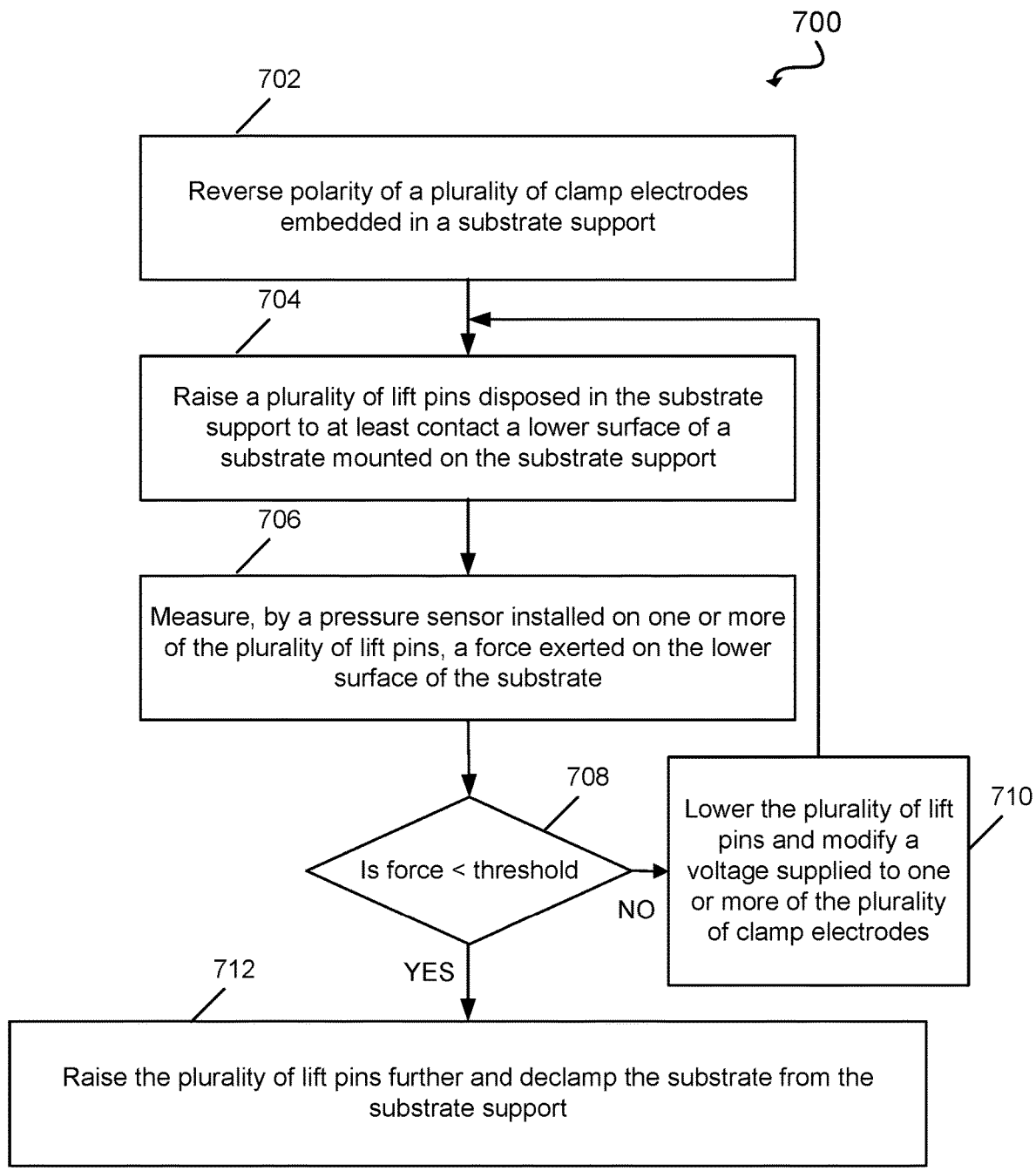
FIG. 7 illustrates one embodiment of a method for actively discharging a residual charge from a substrate, according to one or more embodiments of the disclosure.

FIG. 7 illustrates one embodiment of a method 700 for actively discharging a residual charge from a substrate. At operation 702, when a process or an operation of a process has been completed on a substrate (e.g., wafer), the substrate is to be declamped or separated from the substrate support (e.g., ESC). The method includes reversing the polarity of the clamp electrodes in the substrate support. For example, if there two clamp electrodes of voltages +5V and −5V, then the polarities are reversed such that the clamp electrodes have voltages of −5V and +5V, respectively. In some embodiments, the residual charge may be discharged by substantially changing the input voltage. For example, if the process is performed at +V and −V, then a declamping operation may be performed typically at −V and +V. However, in some cases, a 0V and 0V may also be used. In a monopolar substrate support, if the process is operated at +V or −V, then applying 0V may achieve the same result of effectively discharge a residual charge from the substrate. Changing the voltage substantially may involve adjusting sensing circuitry in the power supply. Alternatively, exposure to ultraviolet light may effectively discharge a residual charge from the substrate.

At operation 704, a plurality of lift pins may be used to separate or declamp the substrate from the substrate support. For example, the lift pins may be actuated using a linear actuator or a stepper motor. In some embodiments, the movement of the lift pins may be controlled by a controller, which may control the actuator or stepper motor driving the lift pins. When the lift pins are actuated, the lift pins may be raised to contact a bottom surface of a substrate clamped on the substrate support.

In some embodiments, the lift pins may include one or more force sensors (e.g., pressure sensors) to measure a force exerted by the substrate on the lift pin contacting the bottom surface. The force sensors may include any type of force sensor including but not limited to pressure sensors, (microelectromechanical systems) MEMS sensors, or any other sensor having a transducer to measure force. The transducer may be resistive, capacitive, or inductive in nature. At operation 706, the force sensors measure a force upon contact of the lift pins with the substrate surface. The force may be measured using force sensors that may be installed on a tip of one or more lift pins, or using force sensors that may be installed anywhere within a body of one or more lift pins. At operation 708, if the measured force is within a threshold range (e.g., less than a threshold value), then the lift pins are further raised to a first height to separate or declamp the substrate from the substrate support, at operation 712. However, if the force is greater than the threshold range (e.g., equal to or greater than a threshold value), then there is an indication that there is some residual charge on the substrate, and at operation 710, the lift pins are lowered to be housed in the substrate support, and a voltage supplied to the clamp electrodes is modified (e.g., increased or decreased) in order to discharge the residual charge on the substrate, and the lift pins are raised again to measure the force against the substrate. Altering the voltage of the clamp electrodes can include any method including but not limited to deterministic or stochastic, convex or non-convex optimization (e.g., using Newton Ralphson, Runge-Kutta, particle swarm optimization, etc.), or empirically created look up tables etc.

Figure 8:
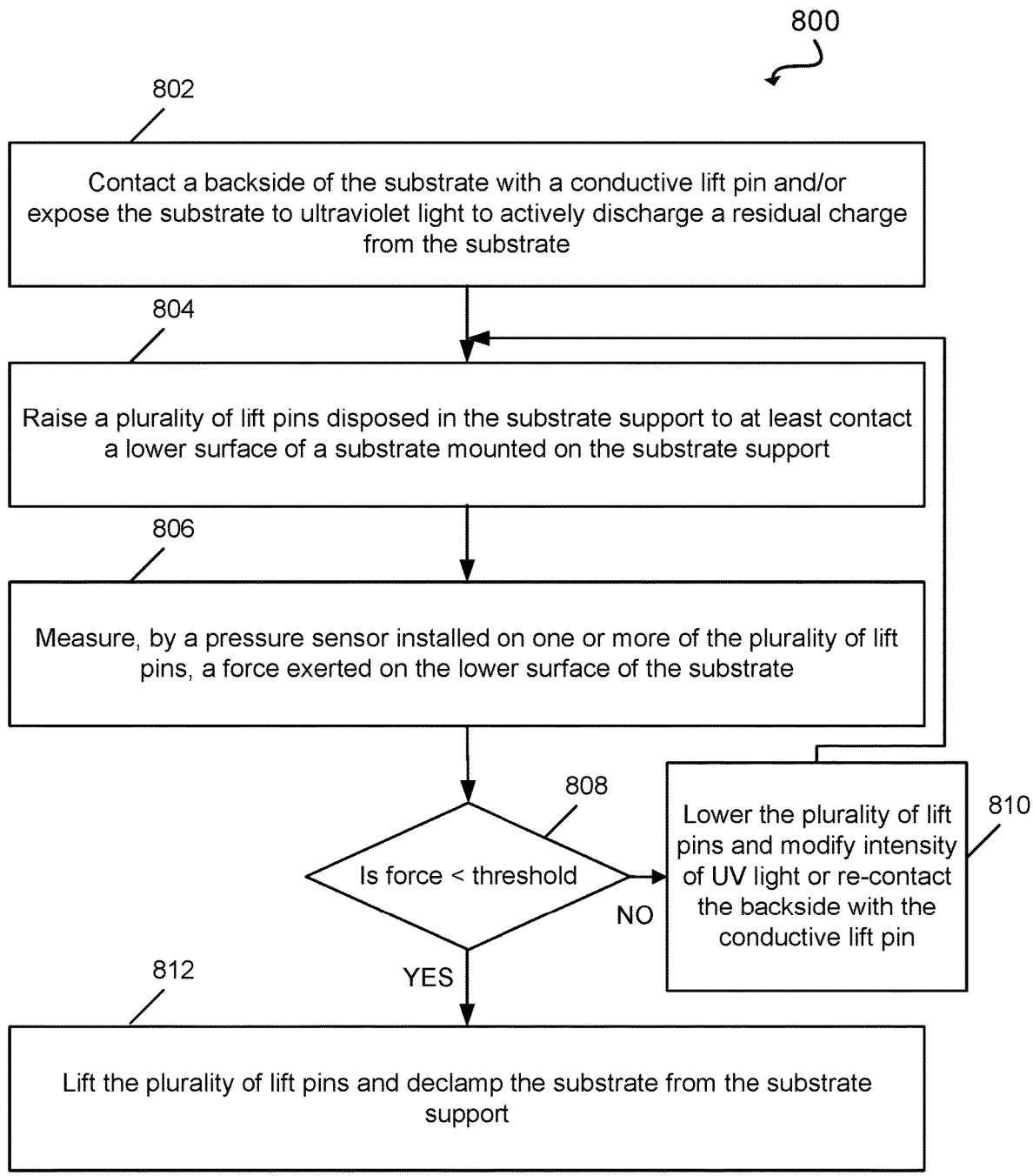
FIG. 8 illustrates one embodiment of a method for actively discharging a residual charge from a substrate, according to one or more embodiments of the disclosure.

FIG. 8 illustrates one embodiment of a method 800 for actively discharging a residual charge from a substrate. When a process or an operation of a process has been completed on a substrate (e.g., wafer), the substrate is to be declamped or separated from the substrate support (e.g., ESC). At operation 802, one or more conductive sleeves or pins (e.g., including Al, W, Ti, or highly doped Si, SiC, sapphire, single crystalline oxynitride, etc.) may be used to contact a bottom surface of the substrate to actively discharge the residual charge on the substrate and to enable efficient declamping of the substrate from the substrate support. Alternatively, the bottom surface and/or top surface of the substrate may be exposed to UV light coming from one or more light sources (e.g., LED, laser diode, etc.) to actively discharge a residual charge from the substrate. In some embodiments, the lift pins may continuously contact the substrate and/or the UV light may be directed onto the substrate for a period of time to discharge all of the residual charge from the substrate. In some embodiments, one or more sensors may be installed within the process chamber to measure the residual charge within the process chamber. In some embodiments, the lift pins may be coated with a conductive material to neutralize and/or minimize the residual charge on the substrate. In some embodiments, a conductive sleeve may be used to neutralize and/or minimize the residual charge on the substrate. Some embodiments may involve a combination of two or more methods described here.

At operation 804, a plurality of lift pins may be used to separate or declamp the substrate from the substrate support. For example, the lift pins may be actuated using a linear actuator or a stepper motor. In some embodiments, the movement of the lift pins may be controlled by a controller, which may control the actuator or stepper motor driving the lift pins. When the lift pins are actuated, the lift pins may be raised to contact a bottom surface of a substrate clamped on the substrate support. In some embodiments, the lift pins may include one or more force sensors (e.g., pressure sensors) to measure a force exerted by the substrate on the lift pin contacting the bottom surface. The force sensors may include any type of force sensor including but not limited to pressure sensors, (microelectromechanical systems) MEMS sensors, or any other sensor having a transducer to measure force. The transducer may be resistive, capacitive, or inductive in nature.

At operation 806, the force sensors measure a force upon contact of the lift pins with the substrate surface. The force may be measured using force sensors that may be installed on a tip of one or more lift pins, or using force sensors that may be installed anywhere within a body of one or more lift pins. At operation 808, if the measured force is within a threshold range (e.g., less than a threshold value), then the lift pins are further raised to a first height to separate or declamp the substrate from the substrate support, at operation 812. However, if the force is greater than the threshold range (e.g., equal to or greater than a threshold value), then there is an indication that there is some residual charge on the substrate, and at operation 810, the lift pins are lowered to be housed in the substrate support, and an intensity of the UV light is modified (e.g., increased or decreased) or the conductive lift pins/sleeves are raised again in order to discharge the residual charge on the substrate. After the residual charge is fully discharged, the lift pins are raised again to measure the force against the substrate. Altering the intensity of the UV light can include any method including but not limited to deterministic or stochastic, convex or non-convex optimization (e.g., using Newton Ralphson, Runge-Kutta, particle swarm optimization, etc.), etc.

FIG. 9 is a block diagram illustrating a computer system 900, according to certain embodiments. In some embodiments, the computer system 900 is controller 235 illustrated in FIG. 2A, which may include a process control component 906 described below with respect to instructions 929. The computer system 900 may be used to control the voltage supplied to the clamp electrodes in the substrate, the lift pins, the UV lights, and/or the conductive sleeves described in the above embodiments.

In some embodiments, computer system 900 is connected (e.g., via a network, such as a Local Area Network (LAN), an intranet, an extranet, or the Internet) to other computer systems. In some embodiments, computer system 900 operates in the capacity of a server or a client computer in a client-server environment, or as a peer computer in a peer-to-peer or distributed network environment. In some embodiments, computer system 900 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 includes a processing device 902, a volatile memory 904 (e.g., Random Access Memory (RAM)), a non-volatile memory 909 (e.g., Read-Only Memory (ROM) or Electrically-Erasable Programmable ROM (EEPROM)), and a data storage device 919, which communicate with each other via a bus 908.

In some embodiments, processing device 902 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 900 further includes a network interface device 922 (e.g., coupled to network 994). In some embodiments, computer system 900 also includes a video display unit 910 (e.g., an LCD), an alphanumeric input device 912 (e.g., a keyboard), a cursor control device 914 (e.g., a mouse), and a signal generation device 920.

In some implementations, data storage device 919 includes a non-transitory computer-readable storage medium 924 on which store instructions 929 encoding any one or more of the methods or functions described herein, including instructions encoding components of FIG. 2A (e.g., controller 235, etc.) and for implementing methods described herein (e.g., one or more of methods 700, 800). In some embodiments, the process control component 906 may be used to control movement of the lift pins, including the order in which the lift pins 202, 204 may be raised or lowered and a height to which the lift pins may be raised. These parameters may be determined based at least on one or more factors such as the state of the incoming wafer shape, material of the wafer, process parameters, ESC sense signals, or a combination thereof. In some embodiments, the data storage device 919 may be coupled to circuitry of the ESC. In some embodiments, the data storage device 919 may store trained data or look up tables that may correlate force with residual charge or wafer type and associated factors for an efficient de-chucking process.

In some embodiments, instructions 929 also reside, completely or partially, within volatile memory 904 and/or within processing device 902 during execution thereof by computer system 900, hence, in some embodiments, volatile memory 904 and processing device 902 also constitute machine-readable storage media. Instructions 929 may include a machine learning model that may be used by the computer system 900 (e.g., controller 235) to control movement of the lift pins based on the residual charge on the substrate. The machine learning model may be used to determine the amount of residual charge on the substrate based on the force sensed by the force sensors. The machine learning model may be trained using data generated by one or more sensors, for example, the force sensed by the force sensors upon contact with the substrate, and/or the clamp voltages being applied to declamp the substrate from the substrate support. Other parameters that may be used in training the machine learning model may include electrostatic chuck parameters such as dielectric thickness, electrode spacing, mesa heights, gas type/flow etc., process parameters such as process duration, gas flows, etc., and chamber parameters such as a liner thickness, material properties, etc. In some embodiments, the machine learning model may be trained on a relationship between the force sensed by the force sensors and the corresponding residual charge measured on the substrate. The residual charge on the substrate can be sensed using terminals connected to the clamp electrodes or by measuring current leakage through the ESC or process chamber walls. Additionally, residual charge in the wafer can be sensed by a force sensor that may be mounted on the tip of the lift pin, by the torque of the motor actuating the lift pin, or through a sense electrode embedded in the ESC.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "identifying," "generating," "training," "storing," "receiving," "determining," "causing," "providing," "obtaining," "updating," "re-training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

The invention claimed is:

1. A method comprising:
    electrostatically securing a substrate during a process using a plurality of clamp electrodes of a substrate support;
    actively discharging a residual charge from the substrate after completion of the process based on at least one of:
        contacting a backside of the substrate with a conductive lift pin; or
        exposing the substrate to ultraviolet light;

partially raising a plurality of lift pins;
measuring, using a pressure sensor, a force exerted on the substrate after partially raising the plurality of lift pins;
determining whether the force exceeds a force threshold; and
responsive to determining that the force exceeds the force threshold, further discharging the residual charge; and
lifting the substrate off of the substrate support after the discharging of the residual charge.

2. The method of claim 1, wherein lifting the substrate off of the substrate support further comprises raising a plurality of lift pins disposed in the substrate support to a first height.

3. The method of claim 1, further comprising:
reversing a polarity of at least one clamp electrode of the plurality of clamp electrodes to repel charged particles at least one of prior to or during the raising of the plurality of lift pins.

4. The method of claim 1, wherein the pressure sensor is disposed on or in one or more lift pins of the plurality of lift pins.

5. The method of claim 1, wherein discharging the residual charge further comprises modifying a voltage supplied to one or more clamp electrodes of the plurality of clamp electrodes.

6. The method of claim 1, further comprising:
inputting the force into a model, wherein the model outputs an estimated residual charge corresponding to the force.

7. The method of claim 1, further comprising:
determining, based on the force, a residual charge accumulated on the substrate.

8. The method of claim 1, wherein exposing the substrate to ultraviolet light further comprises:
directing ultraviolet (UV) light from one or more UV sources onto the substrate.

9. The method of claim 8, wherein directing ultraviolet (UV) light from one or more UV sources further comprises:
modifying an intensity of the one or more UV sources.

10. The method of claim 1, further comprising:
determining that a surface temperature of the substrate mounted on the substrate support is within a threshold range; and
raising a plurality of conductive lift pins disposed in the substrate support to at least contact a lower surface of the substrate to discharge the residual charge accumulated on the substrate.

11. A system comprising:
a process chamber; and
a substrate support mounted in the process chamber, the substrate support comprising:
a plurality of clamp electrodes to electrostatically secure a substrate during a process;
one or more components to actively discharge a residual charge from the substrate after completion of the process, the one or more components comprising at least one of:
one or more conductive lift pins to contact a backside of the substrate; or
one or more light sources to expose the substrate to ultraviolet light; and
a plurality of lift pins to lift the substrate off of the substrate support after discharging the residual charge, wherein the plurality of lift pins comprise the one or more conductive lift pins; and
a controller, wherein the controller is configured to:
partially raise the plurality of lift pins to a first height;
measure, using a pressure sensor, a force exerted on of the substrate after partially raising the plurality of lift pins;
determine whether the force exceeds a force threshold; and
responsive to determining that the force exceeds the force threshold, cause the residual charge to be further discharged before raising the plurality of lift pins to a second height.

12. The system of claim 11, wherein the one or more light sources comprise one or more light-emitting diodes (LED) attached to a foot portion of one or more of the plurality of lift pins.

13. The system of claim 11, wherein the one or more light sources are disposed beneath the substrate support or within the substrate support, and wherein the substrate support comprises one or more through holes for the ultraviolet light to pass through, each of the one or more through holes associated with a light source of the one or more light sources.

14. The system of claim 11, wherein the one or more light sources are disposed beneath the substrate support or within the substrate support, and wherein the substrate support comprises a material that is optically transparent to the ultraviolet light.

15. The system of claim 11, wherein a lift pin of the plurality of lift pins comprises a light source of the one or more light sources embedded within a body of the lift pin, and wherein at least a portion of the body of the lift pin comprises a material that is optically transparent to the ultraviolet light.

16. The system of claim 11, wherein the one or more light sources each comprise at least one of a light-emitting diode (LED), a laser diode, a fiber optic cable, or an LED lamp.

17. The system of claim 11, wherein the controller is further configured to:
reverse a polarity of at least one clamp electrode of the plurality of clamp electrodes to repel charged particles at least one of prior to or during raising of the plurality of lift pins.

18. The system of claim 11, wherein the one or more conductive lift pins comprise a conductive portion, wherein the conductive portion is at least at a tip of the conductive lift pins.

19. The system of claim 11, wherein the one or more conductive lift pins comprise at least one of sapphire or single crystalline oxynitride.

20. The system of claim 11, further comprising one or more non-conductive lift pins.

21. The system of claim 20, wherein each of the one or more conductive lift pins and each of the one or more non-conductive lift pins are individually controlled or raisable to a different height.

* * * * *